(12) United States Patent
Duret et al.

(10) Patent No.: US 10,969,252 B2
(45) Date of Patent: Apr. 6, 2021

(54) SYSTEM FOR DETERMINING AT LEAST ONE ROTATION PARAMETER OF A ROTATING MEMBER

(71) Applicant: NTN-SNR ROULEMENTS, Annecy (FR)

(72) Inventors: Christophe Duret, Bluffy (FR); Cécile Flammier, Annecy (FR)

(73) Assignee: NTN-SNR Roulements, Annecy (FR)

( * ) Notice: Subject to any disclaimer, the term of this patent is extended or adjusted under 35 U.S.C. 154(b) by 24 days.

(21) Appl. No.: 16/332,172

(22) PCT Filed: Sep. 12, 2017

(86) PCT No.: PCT/FR2017/052431
§ 371 (c)(1),
(2) Date: Mar. 11, 2019

(87) PCT Pub. No.: WO2018/051011
PCT Pub. Date: Mar. 22, 2018

(65) Prior Publication Data
US 2019/0265073 A1    Aug. 29, 2019

(30) Foreign Application Priority Data

Sep. 13, 2016 (FR) ...................... 1658522

(51) Int. Cl.
*G01D 5/245* (2006.01)
*H02P 6/14* (2016.01)
(Continued)

(52) U.S. Cl.
CPC ............. *G01D 5/2451* (2013.01); *G01D 5/12* (2013.01); *G01D 5/165* (2013.01); *G01D 5/245* (2013.01); *H01L 43/06* (2013.01); *H02P 6/14* (2013.01)

(58) Field of Classification Search
CPC . G01B 7/30; H01L 43/06; G01D 5/12; G01D 5/165; G01D 5/245; H02P 6/14
(Continued)

(56) References Cited

U.S. PATENT DOCUMENTS 4,240,069 A * 12/1980 Hullein ................ G01D 5/2451
250/231.14
5,243,187 A * 9/1993 Hettlage .............. G01D 5/2451
250/231.16
(Continued)

FOREIGN PATENT DOCUMENTS

DE        10309027 A1    9/2004
EP         0927872 A1 *  7/1999  ............. G01D 5/145
(Continued)

OTHER PUBLICATIONS

International search report corresponding to PCT/FR2017/052431 dated Dec. 6, 2017.

*Primary Examiner* — Clayton E. LaBalle
*Assistant Examiner* — Kevin C Butler
(74) *Attorney, Agent, or Firm* — Murtha Cullina LLP

(57) ABSTRACT

The invention relates to a system having a coder with a magnetic track that exhibits an alternation of North and South magnetic poles separated by i Archimedean spiral transitions. The invention also includes a rotation sensor able to detect the periodic magnetic field emitted by the coder using several sensitive elements, the sensitive elements being distributed angularly along the magnetic track while forming between at least two sensitive elements an angle α which is designed so that the signals delivered by the elements are in quadrature.

9 Claims, 1 Drawing Sheet

(51) Int. Cl.
*G01D 5/165* (2006.01)
*H01L 43/06* (2006.01)
*G01D 5/12* (2006.01)

(58) Field of Classification Search
USPC .................................................. 324/207.25
See application file for complete search history.

(56) References Cited

U.S. PATENT DOCUMENTS

| | | | | |
|---|---|---|---|---|
| 5,479,057 A * | 12/1995 | Rossi | ................... | G01D 5/165 310/68 B |
| 5,528,139 A * | 6/1996 | Oudet | ..................... | G01B 7/30 324/207.2 |
| 5,635,835 A * | 6/1997 | Mouchot | ............... | B82Y 10/00 257/E43.004 |
| 6,163,147 A * | 12/2000 | Peilloud | ................ | G01D 5/145 324/207.2 |
| 6,433,536 B1 * | 8/2002 | Yundt | .................... | G01D 5/145 324/207.2 |
| 6,567,033 B1 * | 5/2003 | Astic | ........................ | G01B 7/30 324/207.23 |
| 6,593,733 B1 * | 7/2003 | Nicot | ..................... | F16C 41/04 324/207.25 |
| 6,593,734 B1 * | 7/2003 | Gandel | .................... | G01B 7/30 324/207.2 |
| 7,248,185 B2 * | 7/2007 | Legrand | ............. | F02D 41/0097 341/15 |
| 7,249,527 B2 * | 7/2007 | Desbiolles | ............ | G01L 3/104 73/862.321 |
| 7,429,133 B2 * | 9/2008 | Gallion | .................. | G01P 3/443 384/448 |
| 7,452,492 B2 * | 11/2008 | Sautier | .................. | G01D 5/145 264/104 |
| 7,592,799 B2 * | 9/2009 | Nakajima | ............... | B60T 8/329 324/174 |
| 8,179,126 B2 * | 5/2012 | Li | ......................... | G01D 5/145 324/207.2 |
| 8,217,808 B2 * | 7/2012 | Fazilleau | ............ | G01D 5/2451 341/11 |
| 10,145,709 B2 * | 12/2018 | Lin | ...................... | G01D 5/2452 |
| 2001/0030534 A1 * | 10/2001 | Apel | .................... | G01D 11/245 324/207.2 |
| 2004/0061459 A1 * | 4/2004 | Desbiolles | ......... | B62D 15/0235 318/400.38 |
| 2004/0061460 A1 * | 4/2004 | Desbiolles | ............. | H02K 5/173 318/400.38 |
| 2007/0139042 A1 * | 6/2007 | Legrand | ............... | G01D 5/2457 324/207.25 |
| 2009/0219016 A1 * | 9/2009 | Debrailly | ............. | G01D 5/145 324/207.25 |
| 2010/0013463 A1 * | 1/2010 | Ozaki | ................... | F16C 41/007 324/207.2 |
| 2010/0102801 A1 * | 4/2010 | Takahashi | .............. | G01D 5/145 324/207.25 |
| 2011/0127995 A1 * | 6/2011 | Nishikawa | ............. | G01P 1/026 324/207.14 |
| 2012/0161755 A1 * | 6/2012 | Masson | ................. | G01D 5/145 324/207.24 |
| 2013/0187640 A1 * | 7/2013 | Corona | .................... | G01B 7/30 324/207.21 |
| 2015/0192430 A1 * | 7/2015 | Blokland | .............. | H01R 12/585 324/207.25 |
| 2016/0076914 A1 * | 3/2016 | Gotz | ..................... | G01D 5/2497 702/150 |
| 2017/0360331 A1 * | 12/2017 | Bassez | ................. | G01B 3/1084 |
| 2019/0265073 A1 * | 8/2019 | Duret | ................... | G01D 5/2451 |

FOREIGN PATENT DOCUMENTS

| | | | |
|---|---|---|---|
| EP | 0927872 A1 | | 7/1999 |
| FR | 2955669 A1 | * | 7/2011 ............... H02P 6/14 |
| FR | 2955669 A1 | | 7/2011 |
| JP | 2009168679 A | | 7/2009 |
| WO | 2004083881 A1 | | 9/2004 |
| WO | 2006064169 A2 | | 6/2006 |

\* cited by examiner

SYSTEM FOR DETERMINING AT LEAST ONE ROTATION PARAMETER OF A ROTATING MEMBER

CROSS-REFERENCE TO RELATED APPLICATIONS

This application claims the benefit of International application number PCT/FR2017/052431, filed Sep. 12, 2017 and French application number 1658522, filed Sep. 13, 2016 the entire contents of which are incorporated herein by reference.

TECHNICAL FIELD

The invention relates to a system for determining at least one rotation parameter of a rotating member, said system comprising a coder emitting a periodic magnetic signal as well as a rotation sensor capable of detecting the magnetic field.

BACKGROUND

In numerous uses, it is desired to know in real time and with optimal quality at least one rotation parameter of a rotating member, such as its position, its speed, its acceleration or its direction of movement.

To do this, the document WO-2006/064169 proposes the use of a coder intended to be rigidly connected to the mobile member and on which a magnetic track is formed that is capable of emitting a pseudo-sinusoidal magnetic field at a reading distance from a sensor comprising several sensitive elements.

Advantageously, each sensitive element can comprise at least one pattern containing a tunnel-effect magnetoresistive material (TMR for Tunnel MagnetoResistance), the resistance of which varies according to the magnetic field detected, as described for example in the document WO-2004/083881.

In order to determine a parameter of movement of the mobile member according to the evolution of the magnetic field detected, the document WO-2006/064169 provides a combination of the signals representative of the resistance of each of the sensitive elements in order to deliver two signals in quadrature and of the same amplitude that can be used to calculate the parameter.

In particular, the coder comprises an alternating succession of North and South poles defining a constant polar width $$Lp = \frac{\pi R}{Npp}$$

along the reading radius R for a given number $N_{pp}$ of pairs of poles, the sensitive elements being equally distributed by a distance $$\frac{Lp}{2}$$

in order to be able to deliver the signals in quadrature.

In certain uses, the coder must have a low number of pairs of poles, typically less than 6, in such a way that its polar width $L_p$ becomes significant, in particular approximately ten millimeters.

However, these wide poles deliver a magnetic signal, the sinusoidality of which is poor with a small reading air gap, requiring movement of the sensitive elements away from the magnetic track, which goes against the amplitude of the signal and thus its good detection by the sensitive elements.

Moreover, wide poles require a thickness of the coder it-also greater in order to preserve the sinusoidality of the magnetic signal. This is not favorable to the integration of the coder into reduced dimensions and complicates the magnetisation method since a greater thickness must be magnetically saturated.

Moreover, in particular from the document DE-103 09 027, coders are known, the magnetic transitions of which between the North and South poles extend in an Archimedean spiral, each of the spirals being distributed around the coder by successive rotation by an angle $$\frac{\pi}{Npp}.$$

The advantage of this type of coder is that the polar width $L_p$ of each of the poles along the radius of the coder becomes independent of the number $N_{pp}$ of pairs of poles, thus being able to reconcile a small number of poles with suitable positioning of the sensitive elements relative to the sinusoidality and to the amplitude of the magnetic signal to be detected.

However, the prior art proposes a positioning of the sensitive elements along the radius of such a coder, which poses a certain number of problems.

In particular, in order to satisfy the compromise between sinusoidality and amplitude, the sensitive elements are disposed at an air-gap distance from the magnetic track that is approximately $$\frac{Lp}{2}.$$

Thus, in particular in order to not risk a mechanical interaction between the fixed sensor and the rotating coder, the polar width $L_p$ must be typically between 2 and 6 mm.

However, in order to prevent the effects of edges of the magnetic field delivered by the coder, the sensitive elements must be positioned with respect to the magnetic track with at least one pair of poles on either side, or two $L_p$ on each side in addition to the radial size necessary for the positioning of the sensitive elements.

As a result, the coder must have a significant height, in particular greater than 6·$L_p$, a height that may not be available in certain integrations.

SUMMARY OF THE INVENTION

The invention aims to overcome the problems of the prior art by proposing in particular a system for determining at least one rotation parameter of a rotating member, wherein the compromise between the periodicity and the amplitude of the magnetic signal detected can be satisfied without inducing a specific size constraint for the coder delivering the signal, in particular in relation to a magnetic coder having a small number of pairs of poles.

For this purpose, the invention proposes a system for determining at least one rotation parameter of a rotating member, the system comprising:

a coder intended to be associated in rotation with the rotating member in such a way as to move together with it, the coder comprising a body on which a magnetic track is formed that is capable of emitting a periodic magnetic signal representative of the rotation of the coder, the track exhibiting an alternation of North and South magnetic poles separated by i transitions, each of the transitions extending in an Archimedean spiral defined in polar coordinates with respect to the axis of rotation by the equation $$\rho = \frac{Npp.Lp}{\pi} \cdot (\theta + \theta_i),$$

$N_{pp}$ being the number of pairs of poles of the magnetic track and $L_p$ the polar width of each of the poles along the radius of the coder, the angle $\theta_i$ of rotation of the $i^{th}$ spiral with respect to the first spiral being equal to $$\frac{\pi}{Npp} \cdot i$$

with i between 0 and $2 \cdot N_{pp}-1$,
a rotation sensor able to detect the periodic magnetic field emitted by the coder by means of several magnetic sensitive elements, distributed angularly along the magnetic track while forming between at least two sensitive elements an angle α which is designed so that the signals delivered by the elements are in quadrature.

BRIEF DESCRIPTION OF THE DRAWING

Other particularities and advantages of the invention will appear in the following description, made in reference to the appended figures, in which.

DETAILED DESCRIPTION

Figure 1:
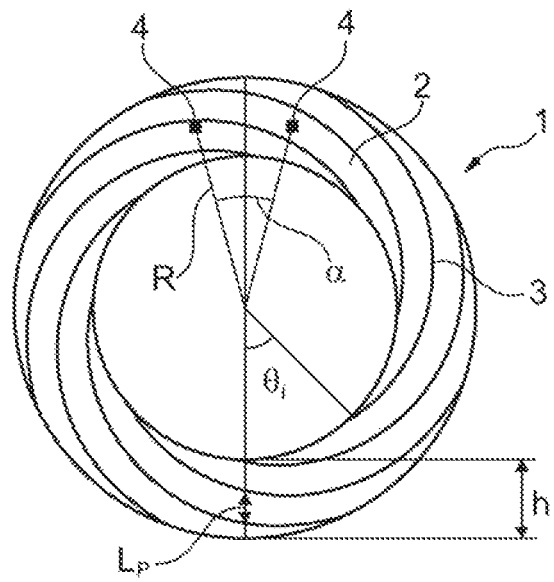
FIGS. 1 and 2 are diagrams of a determination system according to respectively an embodiment of the invention, in particular showing the positioning of the sensitive elements with respect to the coder.

In relation to these figures, a system for determining at least one rotation parameter of a member rotating with respect to a fixed structure is described. In particular, the parameter of the rotating member can be chosen from its position, its speed, its acceleration or its direction of movement.

In a specific use, the system can be used in relation to the control of a brushless direct current electric motor, in particular allowing to know the absolute angular position on a pair of motor poles of the rotor with respect to the stator.

The determination system comprises a coder 1 intended to be rigidly connected to the rotating member in such a way as to move together with it, the coder comprising a body, in particular annular but which can also be discoidal, on which a magnetic track 2 is formed that is capable of emitting a periodic magnetic signal representative of the rotation of the coder. In particular, the magnetic signal emitted can be sinusoidal or pseudo-sinusoidal, that is to say, having at least one portion that can be correctly approximated by a sinusoid.

The track 2 exhibits an alternation of North and South magnetic poles that are separated by i transitions 3, each of the transitions extending in an Archimedean spiral defined in polar coordinates (ρ, θ) with respect to the axis of rotation by the equation $$\rho = \frac{Npp.Lp}{\pi} \cdot (\theta + \theta_i),$$

$N_{pp}$ being the number of pairs of poles of the magnetic track 2 and $L_p$ the polar width of each of the poles along the radius of the coder, the angle $\theta_i$ of rotation of the $i^{th}$ spiral with respect to the first spiral being equal to $$\frac{\pi}{Npp} \cdot i$$

with i between 0 and $2 \cdot N_{pp}-1$.

Thus, the magnetic track 2 delivers a pseudo-sinusoidal magnetic signal, the spatial period of which is equal to $\lambda=2 \cdot L_p$. Moreover, the Archimedean-spiral geometry allows in particular for the number $N_{pp}$ of pairs of poles of the magnetic track 2 as well as the polar width $L_p$ to be chosen independently of the radius R of the magnetic track 2.

According to one embodiment, the coder 1 is formed by a magnet on which the multipolar magnetic track 2 is made. In particular, the magnet can be formed by an annular matrix, for example made from a plastic or elastomer material, in which magnetic particles are dispersed, in particular particles of ferrite or of rare earths like NdFeB.

The determination system comprises a rotation sensor that is intended to be rigidly connected to the fixed structure, the sensor being able to detect the periodic magnetic field emitted by the coder 1. To do this, the sensor comprises several magnetic sensitive elements 4 that are disposed at a reading air gap from the magnetic field delivered by the magnetic track 2, wherein each of the sensitive elements can in particular be chosen from the magnetosensitive probes.

For example, probes based on tunnel magnetoresistances (TMR), anisotropic magnetoresistances (AMR) or giant magnetoresistances (GMR) can measure a component of the magnetic field (normal or tangential to the coder) or the rotating field (resulting from the normal and tangential components).

In particular, as described in the document WO-2004/083881, each pattern forms a tunnel junction by comprising a stack of a reference magnetic layer, of an insulating separation layer and of a magnetic layer sensitive to the field to be detected, the resistance of the stack being a function of the relative orientation of the magnetisation of the magnetic layers.

Advantageously, each sensitive element 4 can comprise at least one pattern made from a magnetoresistive material, the resistance of which varies according to the magnetic field, wherein a sensitive element 4 can comprise a single pattern or a group of patterns connected in series.

Alternatively, the normal component alone of the magnetic field delivered by the coder 1 can be measured, for example via Hall-effect elements. The use of the normal field alone is favorable since it is more sinusoidal than the tangential field.

In order to be able to determine the rotation parameter of the rotating member, the signals delivered by the sensitive elements 4 must be in quadrature, that is to say, out of phase by 90°. In particular, by use of such signals in quadrature, in the sensor or in an associated computer, it is known to determine the angular position of the coder 1, for example by a direct calculation of an arctangent function, using a "Look-Up Table" (LUT) or via a method of the CORDIC type.

To do this, the sensitive elements 4 are distributed angularly along the magnetic track 2 while forming between at least two sensitive elements 4 an angle α which is designed so that the signals delivered by the elements are in quadrature. According to the embodiments shown, the angle α formed between the two sensitive elements 4 is equal to $$\frac{\pi}{2Npp} \text{ modulo } \frac{\pi}{Npp}.$$

Thus, the circumferential distribution of the sensitive elements 4 allows to avoid the effects of edges of the magnetic field delivered by the coder 1, allowing to use a coder 1 having a limited height h, in particular less than $6 \cdot L_p$. In particular, the sensitive elements 4 can be distributed angularly along a radius R, in particular the median radius in the figures, of the magnetic track 2 in order to be as far as possible from the edges of the coder 1.

Moreover, by disposing the sensitive elements 4 at a reading air-gap distance from the magnetic track 2 that is approximately $$\frac{Lp}{2},$$

a good compromise between sinusoidality and amplitude of the signal detected is obtained. In particular, this optimal positioning can be obtained because the polar width $L_p$ can be between 2 and 6 mm, even with a number $N_{pp}$ of pairs of poles of the coder 1 that is less than 6.

Thus, the circumferential distribution of the sensitive elements 4 has in particular the following advantages:
- the distance between the two elements 4 is sufficiently large to use discrete components (1D Hall probes) that are not very costly and very linear;
- the tolerance of circumferential positioning of the elements 4 does not greatly impact the precision of the sensor (since the distance that separates them is large);
- since the two elements 4 are located on the middle radius R of the coder 1, they are not greatly disturbed by the edge effects;
- the positioning of the sensitive elements 4 does not depend on the polar width $L_p$;
- the reading radius R only very slightly affects the quality of the magnetic signal.

In relation to the figures, a system particularly adapted to the control of an electric motor having four pairs of poles is described below, the system providing the absolute position on a pair of motor poles, or 90° mechanical.

To do this, the coder 1 comprises 4 pairs of poles ($N_{pp}$=4), the sensitive elements 4 delivering signals in quadrature on each of the pairs of poles in order for the sensor or the computer for controlling the motor to be able to determine the absolute angular position over an angular sector of 90°.

In relation to FIG. 1, the sensor comprises two sensitive elements 4 forming between them an angle α of $$\frac{\pi}{2Npp} = 22.5°.$$

Figure 2:
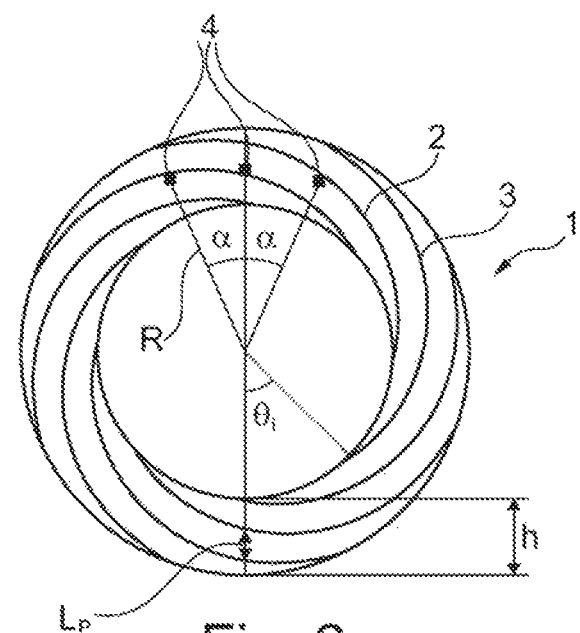

FIG. 2 shows an embodiment having three sensitive elements 4 separated two by two by an angle α of 22.5°.

In particular, the latter embodiment allows two differential measurements of the magnetic field delivered (the one on the left minus the one in the centre on the one hand, the one in the centre minus the one on the right on the other hand). Thus, if the magnetic field comprises a noise component coming from the outside (for example from the motor or from the neighbouring interconnections) identical on the various sensitive elements 4, it will be subtracted from the output signal.

Because of the good sinusoidality of the signal at a reading air-gap distance of approximately $$\frac{Lp}{2},$$

the system can deliver, to the computer for controlling the motor, the absolute angular position on a pair of motor poles of the rotor in a precise manner, which allows in particular:
- better performance, in particular on start-up, for example the time for reaching the speed or position setting;
- "softer" operation, without jumps in torque in a steady state;
- lower energy consumption;
- a lower operating temperature;
- a greater maximum torque.

What is claimed is:

1. A system for determining at least one rotation parameter of a rotating member, the system comprising:
   a coder associated in rotation with the rotating member to move together with it, the coder comprising a body on which a magnetic track is formed for emitting a periodic magnetic signal representative of the rotation of the coder, the track exhibiting an alternation of North and South magnetic poles separated by i transitions, each of the transitions extending in an Archimedean spiral defined in polar coordinates with respect to the axis of rotation by the equation $$\rho = \frac{Npp \cdot Lp}{\pi} \cdot (\theta + \theta_i),$$

Npp being the number of pairs of poles of the magnetic track and Lp the polar width of each of the poles along the radius of the coder, the angle θi of rotation of the ith spiral with respect to the first spiral being equal to $$\frac{\pi}{Npp} \cdot i$$

with i between 0 and 2·Npp−1;
   a rotation sensor to detect the periodic magnetic field emitted by the coder using several magnetic sensitive elements;
   the system wherein the sensitive elements are distributed angularly along the magnetic track while forming between at least two sensitive elements an angle α which is designed so that the signals delivered by the elements are in quadrature.

2. The determination system according to claim 1, wherein the angle α formed between the two sensitive elements is equal to $$\frac{\pi}{2Npp} \text{ modulo } \frac{\pi}{Npp}.$$

3. The determination system according to claim 1, wherein the sensitive elements are distributed angularly along a radius R of the magnetic track.

4. The determination system according to claim 3, wherein the sensitive elements are distributed angularly according to the median radius R of the magnetic track.

5. The determination system according to claim 1, wherein the sensor comprises two sensitive elements.

6. The determination system according to claim 1, wherein the coder has a height that is less than 6·Lp.

7. The determination system according to claim 1, wherein the sensitive elements are disposed at a reading air-gap distance from the magnetic track that is approximately $$\frac{Lp}{2}.$$

8. The determination system according to claim 1, wherein the number Npp of pairs of poles of the coder is less than 6.

9. The determination system according to claim 1, wherein the polar width Lp of the coder is between 2 and 6 mm.

* * * * *